(12) United States Patent
Won et al.

(10) Patent No.: US 9,064,723 B2
(45) Date of Patent: Jun. 23, 2015

(54) SEMICONDUCTOR DEVICES AND METHODS FOR FABRICATING THE SAME

(71) Applicant: SAMSUNG ELECTRONICS CO., LTD., Suwon-si, Gyeonggi-do (KR)

(72) Inventors: Seokjun Won, Seoul (KR); Youngmook Oh, Hwaseong-si (KR); Moonkyun Song, Anyang-si (KR); MinWoo Song, Seongnam-si (KR); Namgyu Cho, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 94 days.

(21) Appl. No.: 13/751,731

(22) Filed: Jan. 28, 2013

(65) Prior Publication Data

US 2013/0299916 A1 Nov. 14, 2013

(30) Foreign Application Priority Data

May 10, 2012 (KR) .......................... 10-2012-0049765

(51) Int. Cl.
*H01L 29/788* (2006.01)
*H01L 27/088* (2006.01)
*H01L 21/8234* (2006.01)
*H01L 27/092* (2006.01)

(52) U.S. Cl.
CPC ...... *H01L 27/088* (2013.01); *H01L 21/823456* (2013.01); *H01L 21/823468* (2013.01); *H01L 21/823481* (2013.01); *H01L 27/092* (2013.01)

(58) Field of Classification Search
CPC ............. H01L 27/088; H01L 29/4232; H01L 21/2815; H01L 29/6656
USPC ........... 257/316, 392, 368, E51.006, E27.06, 257/E21.422, 288, 216, 369, 292; 438/197, 438/151, 184, 199, 283
See application file for complete search history.

(56) References Cited

U.S. PATENT DOCUMENTS

| 6,218,252 | B1 | 4/2001 | Yeo | |
|---|---|---|---|---|
| 6,306,715 | B1 * | 10/2001 | Chan et al. | 438/301 |
| 6,479,392 | B2 | 11/2002 | Yamazaki et al. | |
| 6,486,030 | B2 | 11/2002 | Gonzalez et al. | |

(Continued)

FOREIGN PATENT DOCUMENTS

| KR | 100151066 | 6/1998 |
|---|---|---|
| KR | 1020010045401 | 6/2001 |

(Continued)

*Primary Examiner* — Jarrett Stark
*Assistant Examiner* — Shahed Ahmed
(74) *Attorney, Agent, or Firm* — F. Chau & Associates, LLC

(57) ABSTRACT

A semiconductor device includes a substrate including a first region and a second region, a first gate dielectric layer, a first lower gate electrode, and a first upper gate electrode sequentially stacked on the first region, a second gate dielectric layer, a second lower gate electrode, and a second upper gate electrode sequentially stacked on the second region, a first spacer disposed on a sidewall of the first upper gate electrode, a second spacer disposed on a sidewall of the second upper gate electrode, a third spacer covering the first spacer on the sidewall of the first upper gate electrode, and a fourth spacer covering the second spacer on the sidewall of the second upper gate electrode. At least one of a first sidewall of the first lower gate electrode and a second sidewall of the first lower gate electrode is in contact with the third spacer.

15 Claims, 13 Drawing Sheets

(56) References Cited

U.S. PATENT DOCUMENTS

| | | |
|---|---|---|
| 6,503,844 B2 | 1/2003 | Curello |
| 6,891,235 B1 | 5/2005 | Furukawa et al. |
| 7,078,748 B2 | 7/2006 | Goldbach et al. |
| 7,402,875 B2 | 7/2008 | Datta et al. |
| 8,273,625 B2* | 9/2012 | Shen et al. ............ 438/266 |
| 8,309,411 B2* | 11/2012 | Na et al. ............... 438/229 |
| 2002/0072197 A1* | 6/2002 | Kang et al. ............ 438/424 |
| 2004/0217414 A1* | 11/2004 | Kim ...................... 257/315 |
| 2006/0286713 A1* | 12/2006 | Lee et al. .............. 438/106 |
| 2007/0040223 A1* | 2/2007 | Datta et al. ............ 257/368 |
| 2007/0054457 A1* | 3/2007 | Ueno et al. ............ 438/299 |
| 2007/0298559 A1* | 12/2007 | Brar et al. ............. 438/197 |
| 2008/0153222 A1* | 6/2008 | Lee et al. .............. 438/257 |

FOREIGN PATENT DOCUMENTS

| | | |
|---|---|---|
| KR | 1020060090911 | 8/2006 |
| KR | 1020100029666 | 3/2010 |

* cited by examiner

SEMICONDUCTOR DEVICES AND METHODS FOR FABRICATING THE SAME

CROSS-REFERENCE TO RELATED APPLICATIONS

This application claims priority under 35 U.S.C. §119 to Korean Patent Application No. 10-2012-0049765, filed on May 10, 2012, the disclosure of which is hereby incorporated by reference herein in its entirety.

(i) Technical Field

The present disclosure relates to semiconductor devices and, more particularly, to semiconductor devices and methods for fabricating the same.

(ii) Discussion of the Related Art

Semiconductor devices are widely used in the electronics industry because of its small size, multi-function and/or its low fabrication costs. Semiconductor devices may be categorized as any one of, for example, semiconductor memory devices storing logic data, semiconductor logic devices processing operations of logical data, and hybrid semiconductor devices having both the function of the semiconductor memory devices and the function of the semiconductor logic devices. There has been increasing demand for semiconductor devices having excellent characteristics with the development of the electronic industry. For example, there has been an increasing demand for semiconductor devices having high reliability, high speed, and/or multi-function. For satisfying the above demands, the structures of the semiconductor devices have been complicated and the semiconductor devices have been more highly integrated.

SUMMARY

Embodiments of the inventive concept may provide semiconductor devices preventing undesired etching of a lower gate electrode and methods for fabricating the same.

In an exemplary embodiment, a semiconductor device may include: a substrate including a first region and a second region, a first gate dielectric layer, a first lower gate electrode, and a first upper gate electrode sequentially stacked on the first region, a second gate dielectric layer, a second lower gate electrode, and a second upper gate electrode sequentially stacked on the second region, a first spacer disposed on a sidewall of the first upper gate electrode, a second spacer disposed on a sidewall of the second upper gate electrode, a third spacer covering the first spacer on the sidewall of the first upper gate electrode, and a fourth spacer covering the second spacer on the sidewall of the second upper gate electrode. At least one of a first sidewall of the first lower gate electrode and a second sidewall of the first lower gate electrode may be in contact with the third spacer.

In an embodiment, the third spacer may be in contact with a bottom surface of the first upper gate electrode.

In an embodiment, an undercut region may be defined by a bottom surface of the first upper gate electrode and at least one of the first sidewall and the second sidewall of the first lower gate electrode and the third spacer may extend into the undercut region.

In an embodiment, the semiconductor device may further include: device isolation layers defining an active region. The undercut region may be further defined by a sidewall of the first gate dielectric layer and a top surface of the device isolation layer.

In an embodiment, the device isolation layers may include a first device isolation layer and a second device isolation layer, both of the first and second sidewalls of the first lower gate electrode may be overlapped with the first device isolation layer and the second device isolation layer, respectively, and the undercut region may be further defined by at least one of the first and second sidewalls of the first lower gate electrode.

In an embodiment, a portion of a top surface of the device isolation layer overlapped with the first upper gate electrode may include a dent lower than another portion of the top surface of the device isolation layer not overlapped with the first upper gate electrode.

In an embodiment, the undercut region may be further defined by a top surface of the first gate dielectric layer.

In an embodiment, a sidewall of the second lower gate electrode may be aligned with a sidewall of the second upper gate electrode.

In an embodiment, a sidewall of the second lower gate electrode may be in contact with the second spacer.

In an embodiment, the first spacer may include the same material as the second spacer; the third spacer may include the same material as the fourth spacer, and the material included in the third and fourth spacers may be different from that of the first spacer.

In an embodiment, the first and second lower gate electrodes may include at least one of a metal and a conductive metal nitride, and the first and second upper gate electrodes may include a semiconductor material.

In an embodiment, the first and second dielectric layers may include a material having a dielectric constant higher than a dielectric constant of a silicon oxide layer.

In accordance with an exemplary embodiment, a method for fabricating a semiconductor device may include: forming a first gate structure and a second gate structure on a first region and a second region of a substrate, respectively, with each of the first and second gate structures including a gate dielectric layer, a metal gate electrode, and a semiconductor gate electrode which are sequentially stacked; forming an inner spacer on a sidewall of each of the first and second gate structures, removing a portion of the metal gate electrode exposed by the inner spacer on the first region to form an undercut region and forming an outer spacer filling the undercut region on each of the inner spacers.

In an embodiment, the inner spacer on the second region may be formed to cover a sidewall of the metal gate electrode on the second region.

In an embodiment, forming the undercut region may further include: removing a portion of the gate dielectric layer exposed by the inner spacer on the first region.

In accordance with an exemplary embodiment, a method for fabricating a semiconductor device is provided. The method includes forming a first active region in a substrate, forming an impurity particle on the substrate, sequentially forming a first gate dielectric layer, a first lower gate electrode and a first upper gate electrode on the substrate, forming a first spacer on a first sidewall of the first upper gate electrode, and the first spacer exposes a first sidewall of the first lower gate electrode and a first sidewall of the first gate dielectric layer, and forming a second spacer on a second sidewall of the first upper gate electrode and covering a second sidewall of the first lower gate electrode and a second sidewall of the first gate dielectric layer. A first portion of the first gate dielectric layer and a first portion of the lower gate electrode which are formed on the impurity particle are higher than a second portion of the first gate dielectric layer and a second portion of the first lower gate electrode which are not formed on the impurity particle.

The method further includes etching the first sidewall of the first lower gate electrode and the first sidewall of the first gate dielectric layer exposed by the first spacer to form an undercut region, and the undercut region is defined by a bottom surface of the first upper gate electrode and the first sidewall of the first lower gate electrode and the first sidewall of the first gate dielectric layer, forming a third spacer on the second spacer, wherein the third spacer is spaced apart from the first lower gate electrode and the first gate dielectric layer by the second spacer and forming a fourth spacer on the first spacer, wherein the fourth spacer extends into the undercut region so as to be in contact with the first sidewall of the first lower gate electrode and the first sidewall of the first gate dielectric layer.

BRIEF DESCRIPTION OF THE DRAWINGS

Exemplary embodiments of the inventive concept can be understood in more detail in view of the attached drawings and accompanying detailed description.

DETAILED DESCRIPTION OF EXEMPLARY EMBODIMENTS

Figure 1:
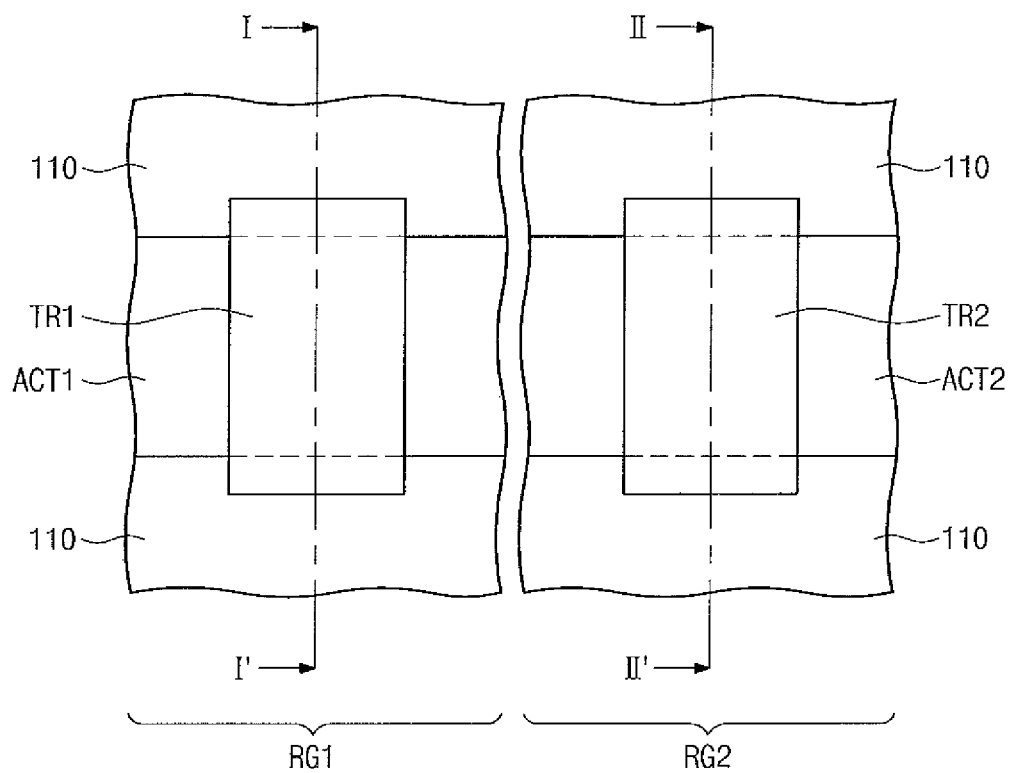
FIG. 1 is a plan view illustrating a semiconductor device according to an embodiment of the inventive concept.

Exemplary embodiments of the inventive concept will now be described more fully hereinafter with reference to the accompanying drawings, in which exemplary embodiments of the inventive concept are shown. In the drawings, embodiments of the inventive concept are not limited to the specific examples provided herein and may be exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Figure 8:
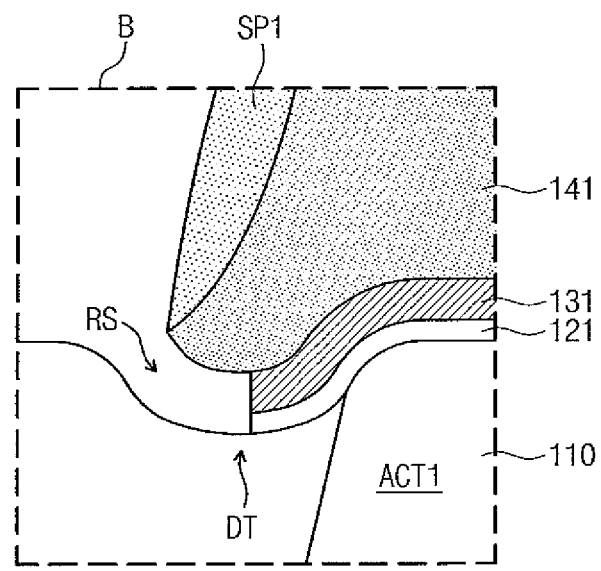

FIG. 1 is a plan view illustrating a semiconductor device according to an embodiment of the inventive concept. FIGS. 2 to 5, 7, 9, and 10 are cross-sectional views taken along lines I-I' and II-II' of FIG. 1 to explain a method for fabricating a semiconductor device according to an embodiment of the inventive concept. FIGS. 6, 8, and 11 are enlarged views of portions of FIGS. 5, 7, and 10, respectively.

Figure 2:
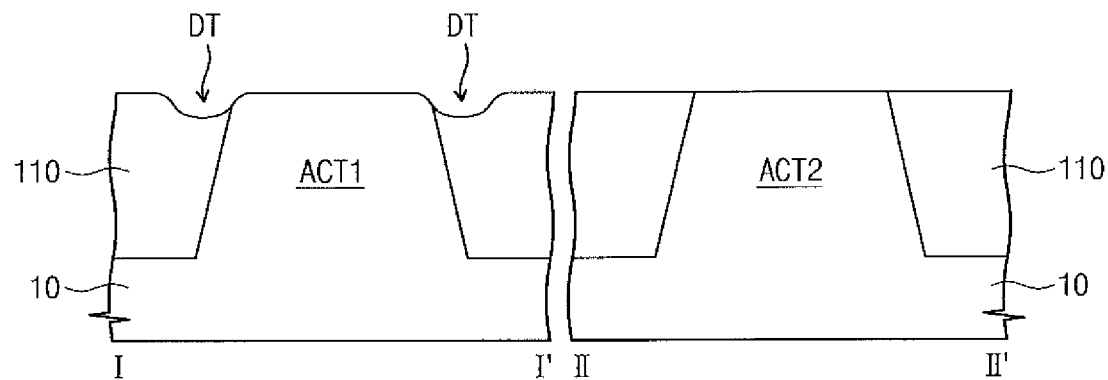
FIGS. 2 to 5, 7, 9, and 10 are cross-sectional views taken along lines I-I' and II-II' of FIG. 1 to explain a method for fabricating a semiconductor device according to an embodiment of the inventive concept.

Referring to FIGS. 1 and 2, a substrate 10 including, for example, a first region RG1 and a second region RG2 may be prepared. The first region RG1 and the second region RG2 may be, for example, transistor regions which are different from each other and included in one semiconductor chip. The first region RG1 and the second region RG2 may be regions spaced apart from each other on one wafer, respectively. For example, in an embodiment, the first region RG1 may correspond to a region on which a first transistor of a static random access memory (SRAM) device is formed, and the second region RG2 may correspond to a region on which a second transistor of the SRAM device is formed. Here, the first transistor may be, for example, different from the second transistor. For example, the first region RG1 may be a PMOS region in which a compressive stress pattern (e.g., a silicon-germanium pattern) having a lattice constant greater than that of silicon is formed, and the second region RG2 may be a NMOS region.

The substrate 10 may include, for example, a semiconductor-based structure. For example, the substrate 10 may be a silicon substrate or a silicon-on-insulator (SOI) substrate. The first region RG1 and the second region RG2 may include, for example, a first active region ACT1 and a second active region ACT2 defined by device isolation layers 110, respectively. The device isolation layers 110 may be formed by, for example, a high-density plasma (HDP) oxide layer, a spin-on-glass (SOG) layer, and/or a chemical vapor deposition (CVD) oxide layer.

In the first region RG1, top surfaces of the device isolation layers 110 may include, for example, dents DT adjacent to the first active region ACT1. On the other hand, the dents DT may, for example, not be formed in the second region RG2. Alternatively, in an embodiment, even if dents are formed in the second region RG2, the dent in the second region RG2 may have, for example, a depth shallower and a width narrower than those of the dent in the first region RG1. The dent DT may be a region having, for example, a top surface lower than the uppermost top surface of the device isolation layer 110 by a predetermined depth. The dents DT may be formed by various processes. For example, the dents DT may be formed by a pre-cleaning process performed after the formation of the device isolation layers 110. Alternatively, a gate dielectric layer of a transistor of another region may be formed, for example, in the first region RG1 and then be removed from the first region RG1, so that the dents DT may be formed in the first region RG1.

Figure 3:
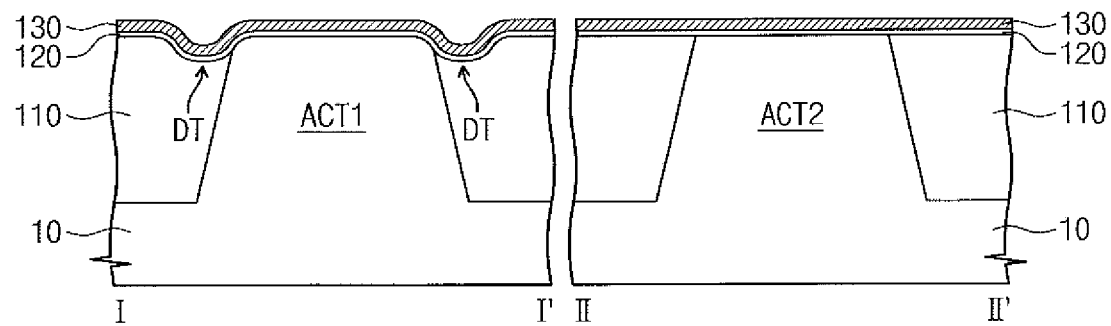

Referring to FIGS. 1 and 3, a first dielectric layer 120 and a first conductive layer 130 may be sequentially formed on the substrate 10. In an embodiment, the first dielectric layer 120 may include, for example, a high-k dielectric layer having a dielectric constant greater than that of a silicon oxide layer. For example, the first dielectric layer 120 may include a hafnium oxide (HfO) layer, an aluminum oxide (AlO) layer, and/or a tantalum oxide (TaO) layer. In an embodiment, the first dielectric layer 120 may include, for example, at least one of a silicon oxide layer, a silicon oxynitride layer, and a silicon nitride layer. The first conductive layer 130 may include, for example, a titanium nitride (TiN) layer, a tantalum nitride (TaN) layer, and/or a tungsten nitride (WN) layer. Each of the first dielectric layer 120 and the first conductive layer 130 may be formed by, for example, a CVD process or a sputtering process.

Figure 4:
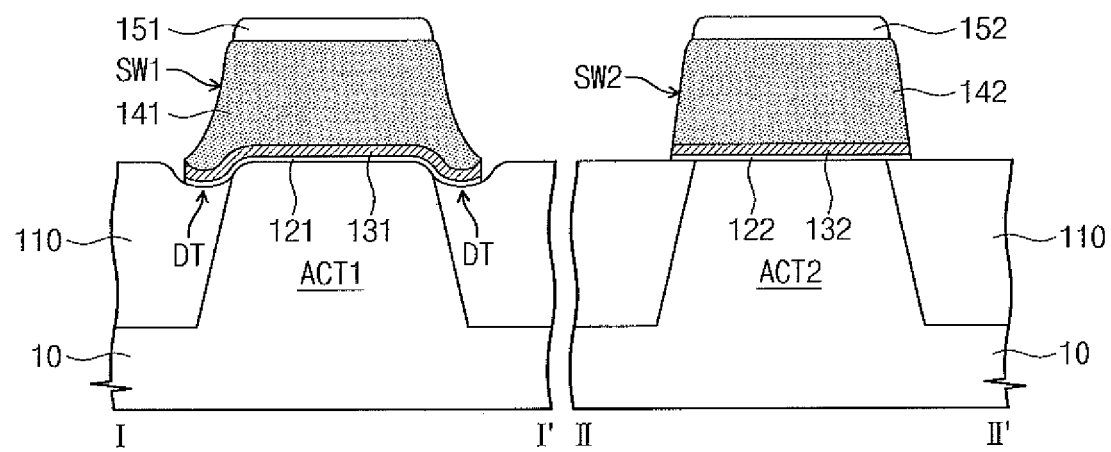

Referring to FIGS. 1 and 4, after a second conductive layer is formed on the first conductive layer 130, a patterning process using first and second mask patterns 151 and 152 as etch masks may be performed on the second conductive layer. Thus, a first upper gate electrode 141 may be formed on the first region RG1 and a second upper gate electrode 142 may be formed on the second region RG2. The second conductive layer may be, for example, thicker than the first conductive layer 130. The first and second upper gate electrodes 141 and 142 may include a semiconductor material such as, for example, silicon, germanium, or silicon-germanium. In an embodiment, the first and second upper gate electrodes 141 and 142 may include, for example, amorphous silicon. The first and second mask patterns 151 and 152 may include, for example, silicon oxide or silicon oxynitride. Thereafter, the first conductive layer 130 and the first dielectric layer 120 may, for example, be successively patterned to form a first gate dielectric layer 121 and a first lower gate electrode 131 in the first region RG1 and a second gate dielectric layer 122 and a second lower gate electrode 132 in the second region RG2. The patterning process may include, for example, a dry etching process and/or a wet etching process.

The first lower gate electrode 131 and the first upper gate electrode 141 may cross over the first active region ACT1, so as to extend onto the top surfaces of the device isolation layers 110 adjacent to the first active region ACT1. A sidewall SW1 of the first upper gate electrode 141 formed on the dent DT may have, for example, a concave curvature toward the first active region ACT1 due to the shape of the dent DT. Alternatively, a sidewall SW2 of the second upper gate electrode 142 may be, for example, substantially flat-shaped.

Figure 5:
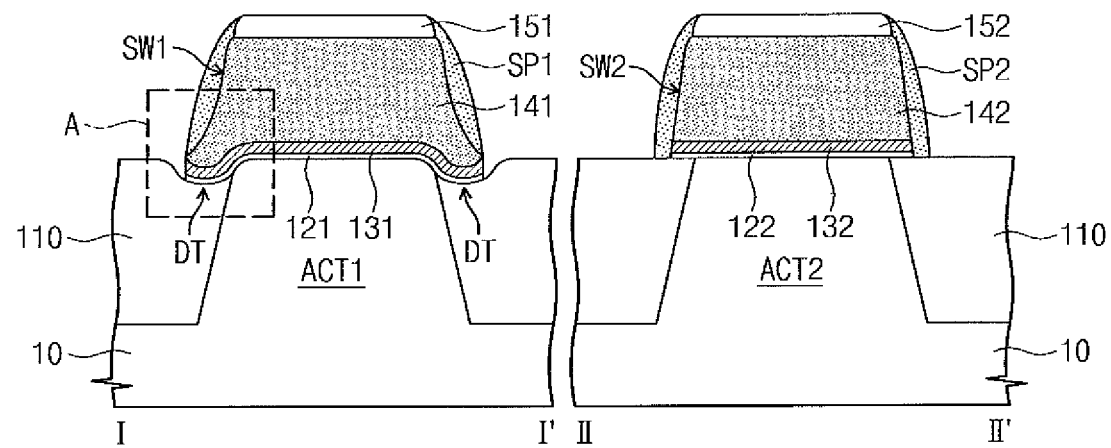
Figure 6:
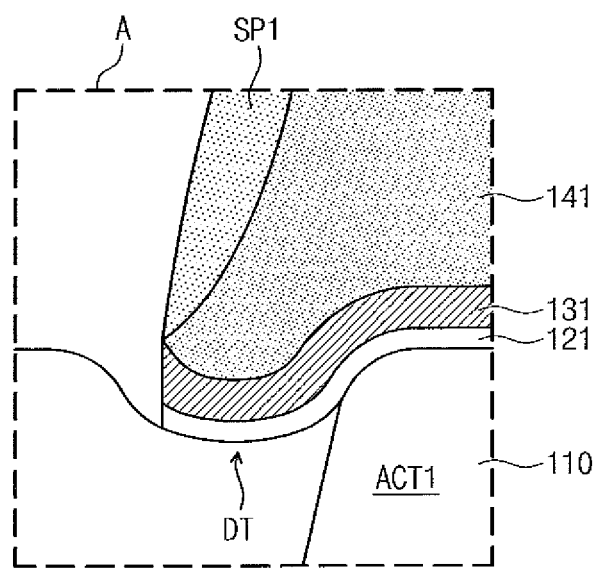
FIGS. 6, 8, and 11 are enlarged views of portions of FIGS. 5, 7, and 10, respectively.
Figure 7:
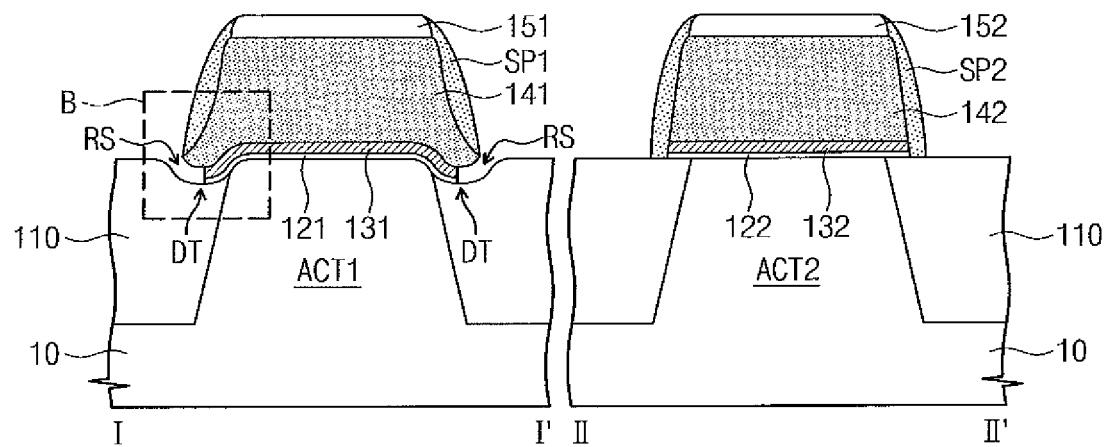

Referring to FIGS. 1, 5, and 6, a first spacer SP1 may be formed on the sidewall SW1 of the first upper gate electrode 141, and a second spacer SP2 may be formed on the sidewall SW2 of the second upper gate electrode 142. FIG. 6 is an enlarged view of a portion A of FIG. 5. After a dielectric layer is formed to cover an entire surface of the substrate 10, the dielectric layer may be, for example, anisotropically dry-etched to form the first spacer SP1 and the second spacer SP2. For example, the first and second spacers SP1 and SP2 may be formed of silicon oxide and/or silicon oxynitride. The first spacer SP1 may expose at least a portion of a sidewall of the first lower gate electrode 131 and a sidewall of the first gate dielectric layer 121. In other words, the first spacer SP1 may not cover the sidewalls of the first lower gate electrode 131 and the first gate dielectric layer 121. The second spacer SP2 may cover a sidewall of the second lower gate electrode 132 and a sidewall of the second gate dielectric layer 122.

Unlike the second lower gate electrode 132 covered by the second spacer SP2, the first lower gate electrode 131 may be damaged by subsequent processes. For example, an etchant (e.g., sulfuric acid), which is used in a wet etching process included in a silicide process and/or a formation process of a stress pattern (e.g., SiGe) of the PMOS region, may damage the first lower gate electrode 131 and be permeated along the top surface of the first active region ACT1. As a result, a transistor in the first region RG1 may be deteriorated. For example, referring to FIGS. 1, 7 and 8, portions of the first lower gate electrode 131 and the first gate dielectric layer 121 may be etched to form undercut regions RS. FIG. 8 is an enlarged view of a portion B of FIG. 7. The undercut region RS may be defined by a bottom surface of the first upper gate electrode 141, the etched sidewall of the first lower gate electrode 131, the etched sidewall of the first gate dielectric layer 121, and the top surface of the device isolation layer 110. The first gate dielectric layer 121 and the first lower gate electrode 131 may be etched simultaneously or be sequentially etched regardless of the order. For example, the etching process of the first gate dielectric layer 121 and the first lower gate electrode 131 may be selectively performed using an etching solution including SC1 and/or $H_2SO_4$. For etching only the portions of the first lower gate electrode 131 and the first gate dielectric layer 121, the substrate 10 may be exposed in the etching solution for a predetermined time during the selective etching process. For example, the etching of the first lower gate electrode 131 may be finished before the first active region ACT1 is exposed by the undercut region RS. As the second lower gate electrode 132 is covered by the second spacer SP2, it may not be etched during the selective etching process.

Figure 9:
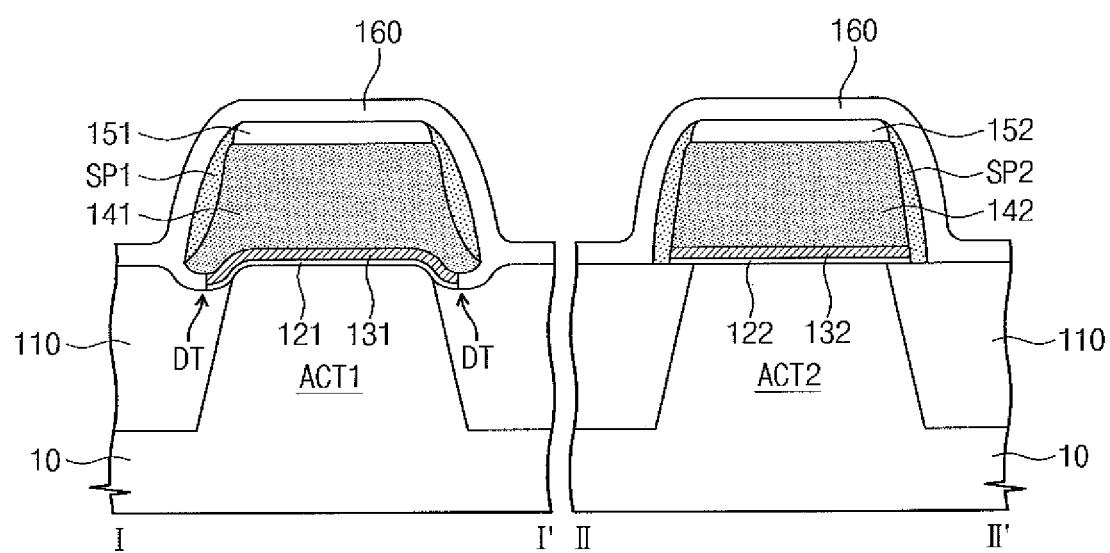

Referring to FIGS. 1 and 9, a second dielectric layer 160 may, for example, be formed to conformally cover an entire surface of the substrate 10 having the undercut regions RS. The second dielectric layer 160 may, for example, fill the undercut regions RS and be in contact with the first lower gate electrode 131 and the first gate dielectric layer 121. The second dielectric layer 160 may be spaced apart from the second lower gate electrode 132 and the second gate dielectric layer 122 by the second spacer SP2. The second dielectric layer 160 may include, for example, a material having an etch selectivity with respect to the first and second spacers SP1 and SP2. For example, if the first and second spacers SP1 and SP2 include silicon nitride or silicon oxinitride, the second dielectric layer 160 may include silicon oxide. The second dielectric layer 160 may be formed by, for example, an atomic layer deposition (ALD) process having an excellent step coverage property.

According to an embodiment of the inventive concept, it is possible to prevent the lower gate electrode exposed by the spacer from being damaged by the subsequent processes. Additionally, the etching process may, for example, be selectively performed to only the transistor having the exposed lower gate electrode and then the second dielectric layer 160 may be formed to prevent damage to the gate electrode.

Figure 10:
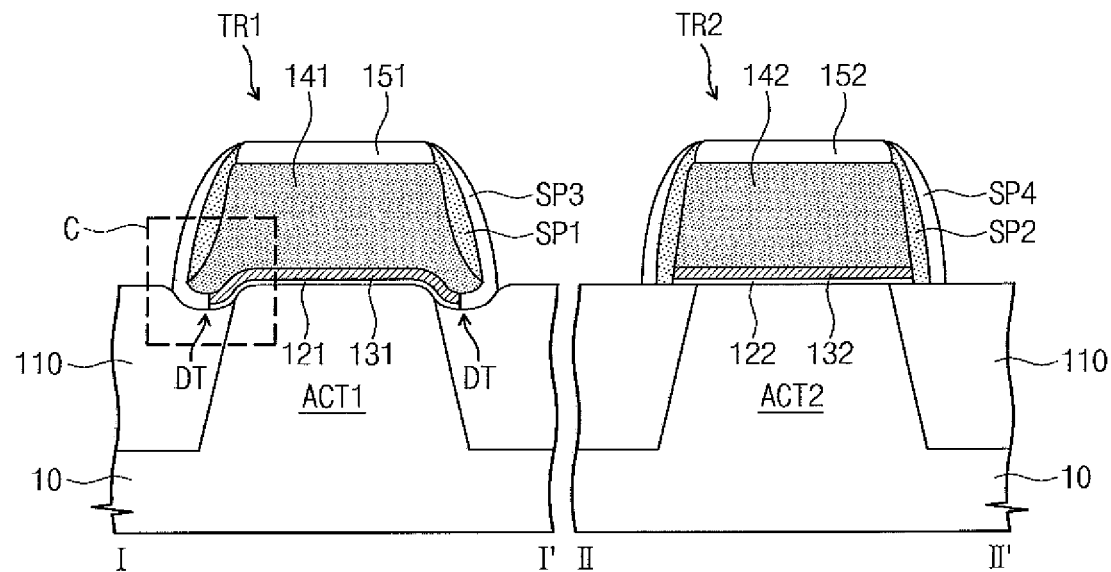
Figure 11:
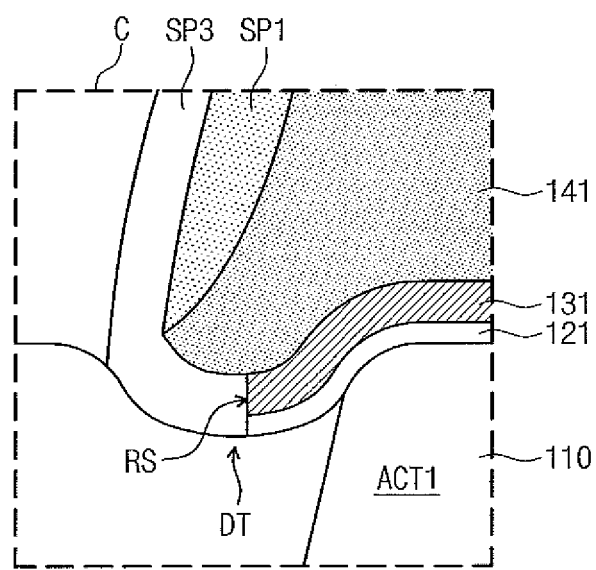

For example, referring to FIGS. 1, 10, and 11, a dry etching process may be performed on the second dielectric layer 160 to form a third spacer SP3 in the first region RG1 and a fourth spacer SP4 in the second region RG2. The third spacer SP3 may, for example, cover a sidewall of the first spacer SP1 and extend into the undercut region RS to come in contact with the first lower gate electrode 131 and the first gate dielectric layer 121. The fourth spacer SP4 may cover a sidewall of the second spacer SP2.

A semiconductor device according to an embodiment of the inventive concept will be described in more detail with reference to FIGS. 1, 10, and 11.

The substrate 10 includes, for example, the first region RG1 and the second region RG2. The first region RG1 and the second region RG2 may, for example, be transistor regions different from each other in one semiconductor chip, respectively. The first region RG1 and the second region RG2 may be regions spaced apart from each other in one wafer, respectively. The substrate 10 may include, for example, a semiconductor-based structure. For example, the substrate 10 may be a silicon substrate or a SOI substrate. The first region RG1 and the second region RG2 may include, for example, a first active region ACT1 and a second active region ACT2 defined by device isolation layers 110, respectively.

In the first region RG1, top surfaces of the device isolation layers 110 may include, for example, dents DT adjacent to the first active region ACT1. In an embodiment, the dents DT may, for example, not be formed in the second region RG2. Alternatively, in an embodiment, even if dents are formed in the second region RG2 the dent in the second region RG2 may have, for example, a depth shallower and a width narrower than those of the dent in the first region RG1. The dent DT may be a region having, for example, a top surface lower than the uppermost top surface of the device isolation layer 110 by a predetermined depth.

For example, a first transistor TR1 may be provided on the first region RG1, and a second transistor TR2 may be provided on the second region RG2. The first transistor TR1 may include, for example, the first gate dielectric layer 121, the first lower gate electrode 131, and the first upper gate electrode 141 which are sequentially stacked on the first active region ACT1. The second transistor TR2 may include, for example, the second gate dielectric layer 122, the second lower gate electrode 132, and the second upper gate electrode 142 which are sequentially stacked on the second active region ACT2. The sidewall of the second lower gate electrode 132 may, for example, be aligned with the sidewall of the second upper gate electrode 142. The first mask pattern 151 and the second mask pattern 152 may be provided on the first upper gate electrode 141 and the second gate electrode 142, respectively. The first and second lower gate electrodes 131 and 132 may be, for example, in contact with the first and second gate dielectric layers 121 and 122, respectively.

The first and second gate dielectric layers 121 and 122 may include, for example, a high-k dielectric layer having a dielectric constant greater than that of a silicon oxide layer. For example, the first and second gate dielectric layers 121 and 122 may include a hafnium oxide (HfO) layer, an aluminum oxide (AlO) layer, and/or a tantalum oxide (TaO) layer. In an embodiment, the first and second gate dielectric layers 121 and 122 may include, for example, at least one of a silicon oxide layer, a silicon oxynitride layer, and a silicon nitride layer. The first and second lower gate electrodes 131 and 132 may include, for example, a metal and/or a conductive metal nitride. For example, the first and second lower gate electrodes 131 and 132 may include titanium nitride (TiN), tantalum nitride (TaN), and/or tungsten nitride (WN). The first and second upper gate electrodes 141 and 142 may include, for example, a semiconductor material such as silicon, germanium, or silicon-germanium.

The first lower gate electrode 131 may, for example, cross over the first active region ACT1, so as to be overlapped with at least one of the device isolation layers 110 disposed at both sides of the first active region ACT1. The first transistor TR1 and the second transistor TR2 may include, for example, the first spacer SP1 formed on the sidewall of the first upper gate electrode 141 and the second spacer SP2 formed on the sidewall of the second upper gate electrode 142, respectively. The first spacer SP1 may, for example, be confinedly disposed on the sidewall of the first upper gate electrode 141 and may not cover the sidewall of the first lower gate electrode 131. The second spacer SP2 may extend, for example, onto the sidewall of the second lower gate electrode 132 and the sidewall of the second gate dielectric layer 122.

The first transistor TR1 may include, for example, the undercut region RS defined by the bottom surface of the first upper gate electrode 141, the sidewall of the first lower gate electrode 131, the sidewall of the first gate dielectric layer 121, and the top surface of the device isolation layer 110. The second transistor TR2 may, for example, not include the undercut region RS.

The third spacer SP3 may be provided on the sidewall of the first spacer SP1, and the fourth spacer SP4 may be provided on the sidewall of the second spacer SP2. The third and fourth spacers SP3 and SP4 may include, for example, a different material from the first and second spacers SP1 and SP2. For example, if the first and second spacers SP1 and SP2 include silicon nitride or silicon oxinitride, the third and fourth spacers SP3 and SP4 may include silicon oxide. The third spacer SP3 may, for example, extend into the undercut region RS to be in contact with the first lower gate electrode 131 and the first gate dielectric layer 121. The fourth spacer SP4 may be spaced apart from the second lower gate electrode 132 and the second gate dielectric layer 122 by the second spacer SP2.

Figure 12:
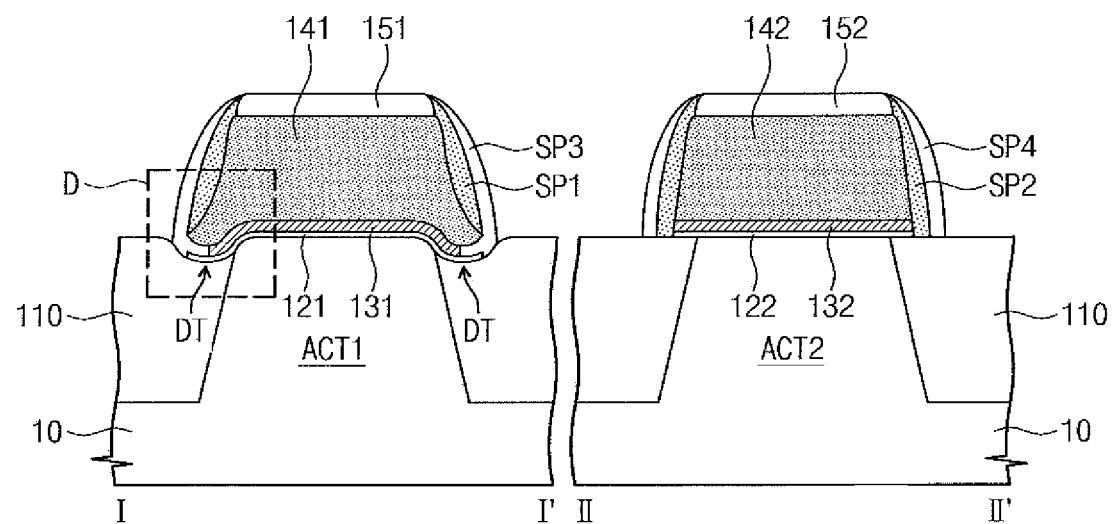
FIGS. 12 and 13 are a cross-sectional view and an enlarged view of a semiconductor device according to an embodiment of the inventive concept.
Figure 13:
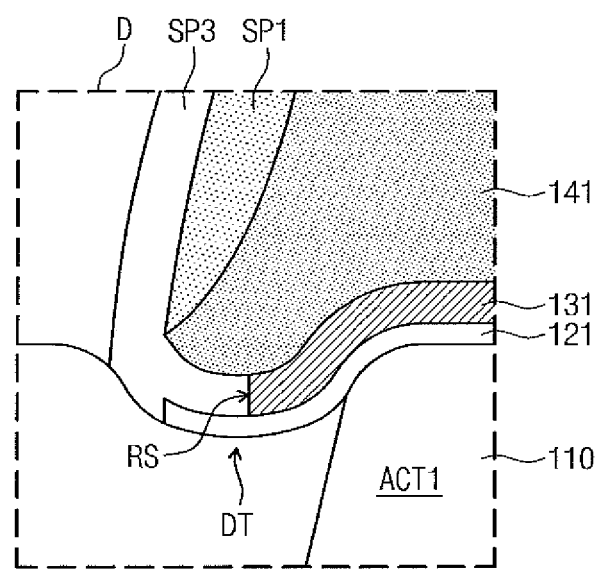

A semiconductor device according to an embodiment of the inventive concept will be described with reference to FIGS. 1, 12, and 13. FIG. 13 is an enlarged view of a portion D of FIG. 12. Other elements of the present embodiment except a shape of an undercut region and a shape of a gate dielectric layer may be substantially the same as the elements of the embodiment of FIGS. 10 and 11 corresponding thereto. For the purpose of ease and convenience in explanation, the descriptions of the same elements as in the semiconductor devices of FIGS. 10 and 11 will be omitted or mentioned briefly.

In the present embodiment, a top surface of the first gate dielectric layer 121 may, for example, define a bottom surface of an undercut region RS. In other words, the undercut region RS may be defined by, for example, the bottom surface of the first upper gate electrode 141, the sidewall of the first lower gate electrode 131, and the top surface of the first gate dielectric layer 121. For example, in the etching process described with reference to FIGS. 7 and 8, the first lower gate electrode 131 may be etched, but the first gate dielectric layer 121 may not be etched. Alternatively, in an embodiment, the first gate dielectric layer 121 may be etched less than the first lower gate electrode 131 to form the undercut region RS in the present embodiment.

FIGS. 14 to 17 are cross-sectional views illustrating a method for fabricating a semiconductor device according to an embodiment of the inventive concept. For the purpose of ease and convenience of explanation, the descriptions to the same elements as in the above-described semiconductor devices will be omitted or mentioned briefly.

Figure 14:
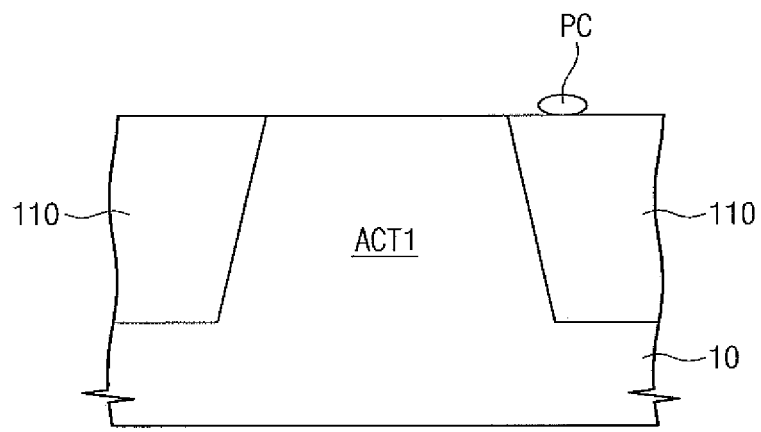
FIGS. 14 to 17 are cross-sectional views illustrating a method for fabricating a semiconductor device according to an embodiment of the inventive concept.

Referring to FIG. 14, a substrate 10 including, for example, a first active region ACT1 may be provided. The first active region ACT1 may be defined by, for example, device isolation layers 110. An impurity particle PC may exist on the substrate 10. For example, the impurity particle PC may be a silicon particle or a silicon oxide particle generated in the formation process of the device isolation layers 110, or an impurity particle supplied from an external system.

Figure 15:
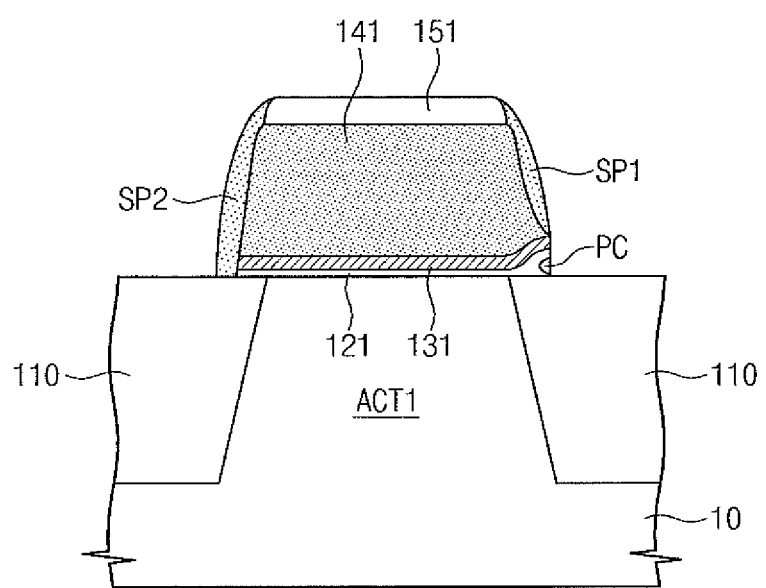

For example, referring to FIG. 15, a first gate dielectric layer 121, a first lower gate electrode 131, and a first upper gate electrode 141 may be sequentially formed on the substrate 10. A first spacer SP1 may be formed on a first sidewall of the first upper gate electrode 141, and a second spacer SP2 may be formed on a second sidewall of the first upper gate electrode 141. A first portion of the first gate dielectric layer 121 and a first portion of the first lower gate electrode 131, which are formed on the impurity particle PC, may, for example, be higher than a second portion of the first gate dielectric layer 121 and a second portion of the first lower gate electrode 131 which are not formed on the impurity particle PC. Due to the surface shape of the first lower gate electrode 131, one sidewall of the first upper gate electrode 141 may have, for example, a concave curvature toward the first active region ACT1. The first spacer SP1 may expose first sidewalls of the first lower gate electrode 131 and the first gate dielectric layer 121, but the second spacer SP2 may cover second sidewalls of the first lower gate electrode 131 and the first gate dielectric layer 121.

Figure 16:
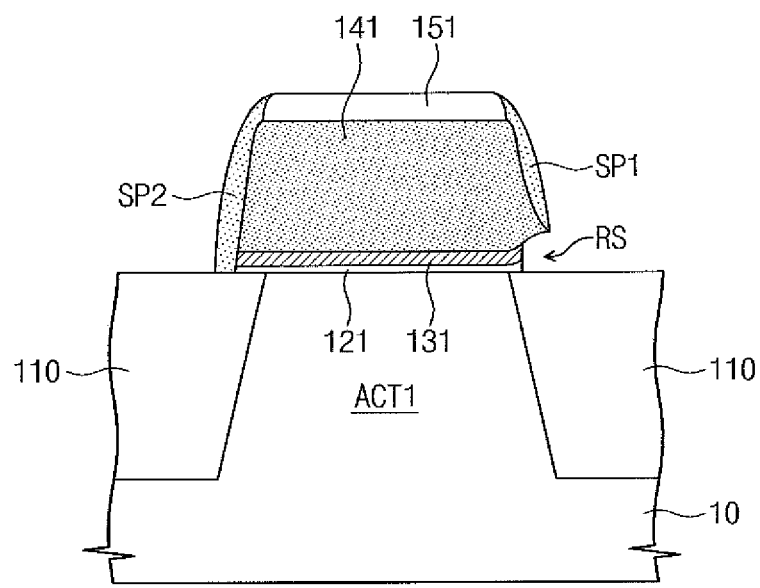

Referring to FIG. 16, the first sidewalls of the first lower gate electrode 131 and the first gate dielectric layer 121 exposed by the first spacer SP1 may be, for example, etched to form an undercut region RS. On the other hand, the second sidewalls of the first lower gate electrode 131 and the first gate dielectric layer 121 covered by the second spacer SP2 may, for example, not be etched.

Figure 17:
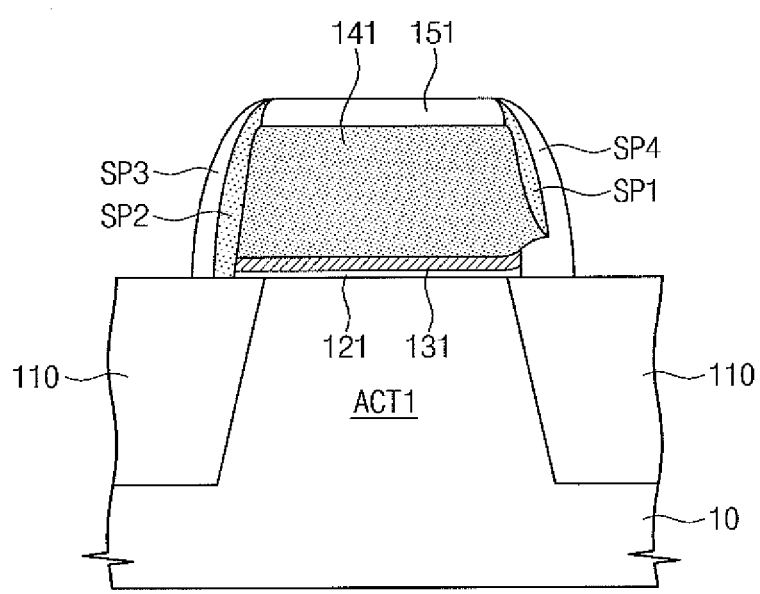

Referring to FIG. 17, a third spacer SP3 may be formed on the second spacer SP2, and a fourth spacer SP4 may be formed on the first spacer SP1. The fourth spacer SP4 may, for example, extend into the undercut region RS, so as to be in contact with the first lower gate electrode 131 and the first gate dielectric layer 121. On the other hand, the third spacer SP3 may be spaced apart from the first lower gate electrode 131 and the first gate dielectric layer 121 by the second spacer SP3. In the present embodiment, the undercut region RS may, for example, be confinedly formed in one sidewall of one gate electrode and may not be formed in another sidewall of the one gate electrode.

In the aforementioned semiconductor devices, the sidewall of the lower gate electrode may be exposed by the dent or the impurity particle. However, exemplary embodiments of the inventive concept are not limited thereto. The sidewall of the lower gate electrode may be exposed by various factors of, for example, an etching process and/or a deposition process for forming a semiconductor device.

Figure 18:
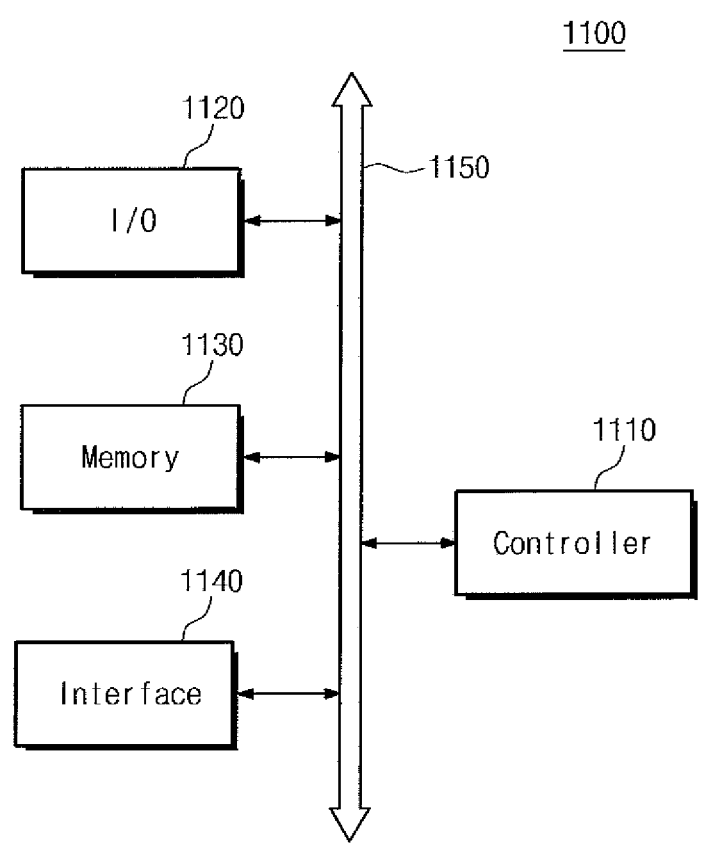
FIG. 18 is a schematic block diagram illustrating an example of electronic systems including semiconductor devices according to an embodiment of the inventive concept.

FIG. 18 is a schematic block diagram illustrating an example of electronic systems including semiconductor devices according to an embodiment of the inventive concept.

Referring to FIG. 18, an electronic system 1100 according to an embodiment of the inventive concept may include, for example, a controller 1110, an input/output (I/O) unit 1120, a memory device 1130, an interface unit 1140, and a data bus 1150. For example, at least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include, for example, at least one of a microprocessor, a digital signal processor, a microcontroller, and other logic devices. The other logic devices may have a similar function to any one of the microprocessor, the digital signal processor and the microcontroller. The I/O unit 1120 may include, for example, a keypad, a keyboard and/or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include, for example, a fast DRAM device and/or a fast SRAM device which acts as a cache memory for increasing the operation of the controller 1110. The semiconductor device according to an embodiment of the inventive concept may be provided in the memory device 1130, the controller 1110, and/or the I/O unit 1120.

The electronic system 1100 may be applied to, for example, a personal digital assistant (PDA), a portable computer, a web tablet, a wireless phone, a mobile phone, a digital music player, a memory card or other electronic products. The other electronic products may receive or transmit information data by wireless.

Figure 19:
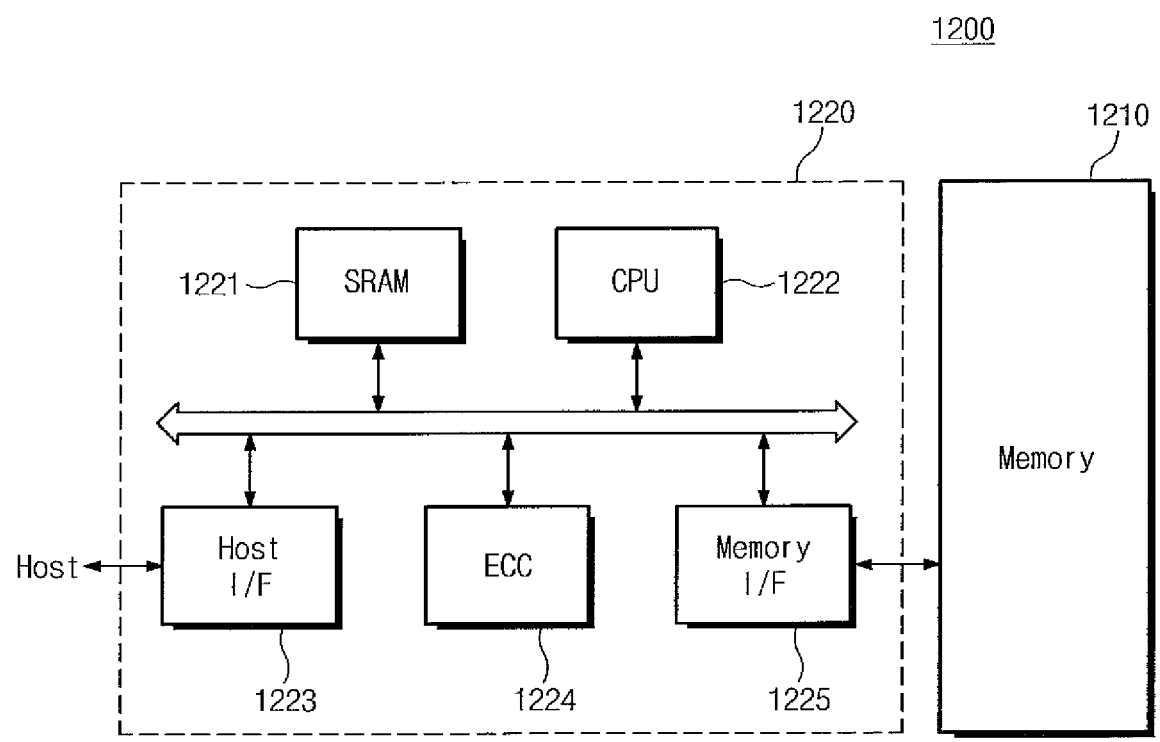
FIG. 19 is a schematic block diagram illustrating an example of memory cards including semiconductor devices according to an embodiment of the inventive concept.

FIG. 19 is a schematic block diagram illustrating an example of memory cards including semiconductor devices according to an embodiment of the inventive concept.

Referring to FIG. 19, a memory card 1200 may include, for example, a memory device 1210. The memory device 1210 may include, for example, at least one of the semiconductor devices according to an embodiment mentioned above. The memory device 1210 may further include, for example, other types of semiconductor memory devices which are different from the semiconductor devices according to an embodiment described above. For example, the memory device 1210 may further include a non-volatile memory device (e.g. a magnetic memory device, a phase change memory device, etc), a dynamic random access memory (DRAM) device and/or a static random access memory (SRAM) device. The memory card 1200 may include, for example, a memory controller 1220 that controls data communication between a host and the memory device 1210.

The memory controller 1220 may include, for example, a central processing unit (CPU) 1222 that controls overall operations of the memory card 1200. In addition, the memory controller 1220 may include, for example, a SRAM device 1221 used as an operation memory of the CPU 1222. Moreover, the memory controller 1220 may further include, for example, a host interface unit 1223 and a memory interface unit 1225. The host interface unit 1223 may be configured to include, for example, a data communication protocol between the memory card 1200 and the host. The memory interface unit 1225 may connect the memory controller 1220 to the memory device 1210. The memory controller 1220 may further include, for example, an error check and correction (ECC) block 1224. The ECC block 1224 may detect and correct errors of data which are read out from the memory device 1210. Even though not shown in the drawings, the memory card 1200 may further include, for example, a read only memory (ROM) device that stores code data to interface with the host. The memory card 1200 may be used as, for example, a portable data storage card. Alternatively, the memory card 1200 may realized as, for example, solid state disks (SSD) which are used as hard disks of computer systems.

Figure 20:
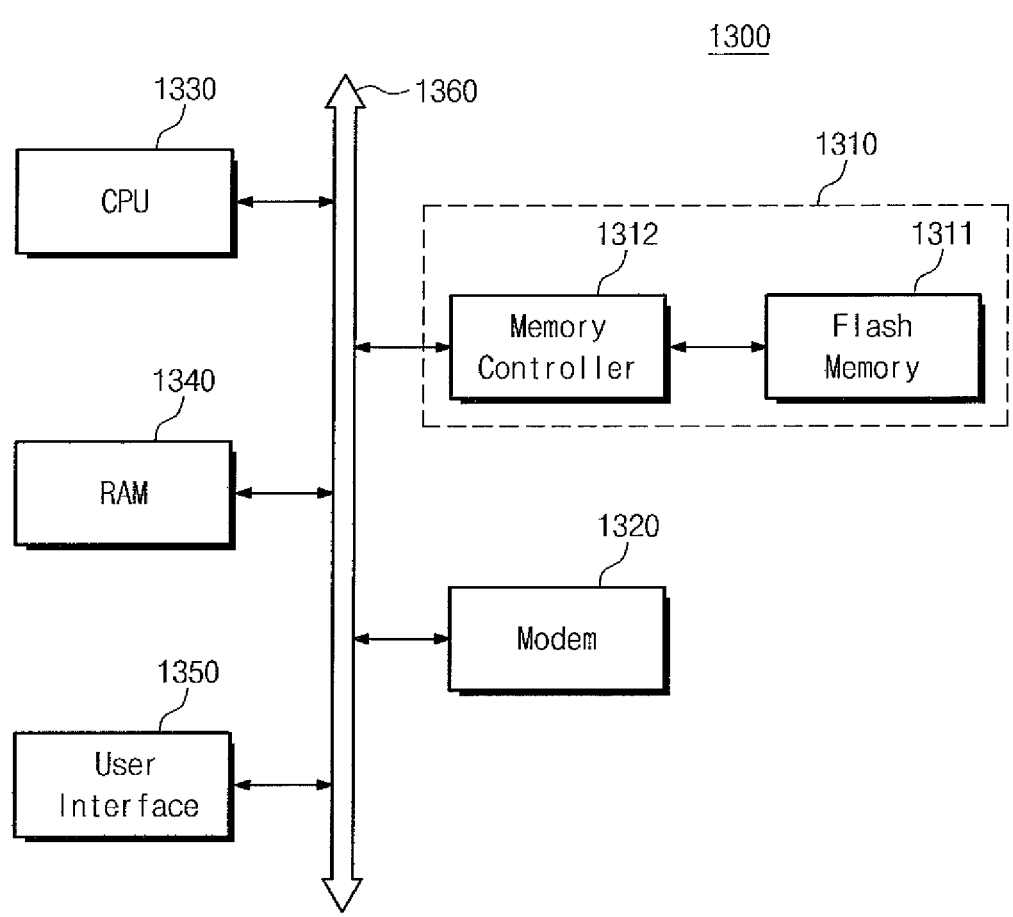
FIG. 20 is a schematic block diagram illustrating an example of information processing systems including semiconductor devices according to an embodiment of the inventive concept.

FIG. 20 is a schematic block diagram illustrating an example of information processing systems including semiconductor devices according to an embodiment of the inventive concept.

Referring to FIG. 20, a flash memory system 1310 including the semiconductor device according to an embodiment of the inventive concept may be installed in, for example, an information process system 1300 such as a mobile device or a desk top computer. The information process system 1300 according to the inventive concept may include, for example, a modem 1320, a central processing unit (CPU) 1330, a random access memory (RAM) 1340, and a user interface unit 1350 that are electrically connected to the flash memory system 1310 through a system bus 1360. Data processed by the CPU 1330 or data inputted form the outside of flash memory system 1310 may be stored in the flash memory system 1310. Here, the flash memory system 1310 may be realized as, for example, a solid state disk (SSD) device. In this case, the information processing system 1300 may stably store massive data in the flash memory system 1310. Additionally, as the reliability of the flash memory system 1310 increases, the flash memory system 1310 may reduce a resource consumed for correcting errors. Even though not shown in the drawings, an application chipset, a camera image processor (CIS), and/or an input/output unit may further be provided in the information processing system 1300.

The semiconductor devices according an embodiment described above may be encapsulated using various packaging techniques. For example, the semiconductor devices according to an embodiment may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dim in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

According to an embodiment of the inventive concept, it is possible to prevent undesired etching of the lower gate electrode. Thus, an error ratio of the semiconductor device may be reduced. Additionally, the etching process may be selectively performed on only the exposed lower gate electrode of the transistor. Having described exemplary embodiments of the inventive concept, it is further noted that it is readily apparent to those of ordinary skill in the art that various modifications may be made without departing from the spirit and scope of the invention which is defined by the metes and bounds of the appended claims.

What is claimed is:

1. A semiconductor device comprising:
   a substrate including a first region and a second region;
   a first gate dielectric layer, a first lower gate electrode, and a first upper gate electrode sequentially stacked on the first region, wherein the first lower gate electrode is in direct contact with the first upper gate electrode, and wherein an undercut region is defined by a bottom surface of the first upper gate electrode and at least one of the first sidewall and the second sidewall of the first lower gate electrode;
   a second gate dielectric layer, a second lower gate electrode, and a second upper gate electrode sequentially stacked on the second region, wherein the second lower gate electrode is in direct contact with the second upper gate electrode;
   a first spacer disposed on a sidewall of the first upper gate electrode;
   a second spacer disposed on a sidewall of the second upper gate electrode;
   a third spacer covering the first spacer on the sidewall of the first upper gate electrode, wherein the third spacer extends into the undercut region;
   a fourth spacer covering the second spacer on the sidewall of the second upper gate electrode and
   a plurality of device isolation layers defining an active region, wherein the undercut region is further defined by a sidewall of the first gate dielectric layer and a top surface of the plurality of device isolation layers,
   wherein at least one of a first sidewall of the first lower gate electrode and a second sidewall of the first lower gate electrode is in contact with the third spacer,
   wherein the third spacer is in contact with a bottom surface of the first upper gate electrode,
   wherein the plurality of device isolation layers includes a first device isolation layer and a second device isolation layer, wherein both of the first and second sidewalls of the first lower gate electrode are overlapped with the first device isolation layer and the second device isolation layer, respectively, and wherein the undercut region is confined by at least one of the first and second sidewalls of the first lower gate electrode.

2. The semiconductor device of claim 1, wherein the undercut region is further defined by a top surface of the first gate dielectric layer.

3. The semiconductor device of claim 1, wherein a sidewall of the second lower gate electrode is aligned with a sidewall of the second upper gate electrode.

4. The semiconductor device of claim 1, wherein a sidewall of the second lower gate electrode is in contact with the second spacer.

5. The semiconductor device of claim 1, wherein the first spacer includes a same material as the second spacer; wherein the third spacer includes a same material as the fourth spacer; and wherein the material included in the third and fourth spacers is different from a material of the first spacer.

6. The semiconductor device of claim 1, wherein the first and second lower gate electrodes include at least one of a metal and a conductive metal nitride, and wherein the first and second upper gate electrodes include a semiconductor material.

7. The semiconductor device of claim 1, wherein the first and second dielectric layers include a material having a dielectric constant higher than a dielectric constant of a silicon oxide layer.

8. A semiconductor device comprising:
   a substrate including a first region and a second region;
   a first gate dielectric layer, a first lower gate electrode, and a first upper gate electrode sequentially stacked on the first region;
   a second gate dielectric layer, a second lower gate electrode, and a second upper gate electrode sequentially stacked on the second region;
   a first spacer disposed on a sidewall of the first upper gate electrode;
   a second spacer disposed on a sidewall of the second upper gate electrode;
   a third spacer covering the first spacer on the sidewall of the first upper gate electrode;
   a fourth spacer covering the second spacer on the sidewall of the second upper gate electrode; and
   a plurality of device isolation layers defining an active region, wherein the undercut region is further defined by a sidewall of the first gate dielectric layer and a top surface of the device isolation layer,
   wherein at least one of a first sidewall of the first lower gate electrode and a second sidewall of the first lower gate electrode is in contact with the third spacer,
   wherein an undercut region is defined by a bottom surface of the first upper gate electrode and at least one of the first sidewall and the second sidewall of the first lower gate electrode,
   wherein the third spacer extends into the undercut region, and
   wherein a portion of a top surface of the device isolation layer overlapped with the first upper gate electrode includes a dent lower than another portion of the top surface of the device isolation layer not overlapped with the first upper gate electrode.

9. A semiconductor device comprising:
a device isolation layer defining a first active region and a second active region in a substrate;
a first gate dielectric layer, a first lower gate electrode, and a first upper gate electrode sequentially stacked on the first active region, the first active region having a width less than widths of the first lower gate electrode and the first upper gate electrode;
a second gate dielectric layer, a second lower gate electrode, and a second upper gate electrode sequentially stacked on the second active region, the second active region having a width less than widths of the second lower gate electrode and the second upper gate electrode;
a first spacer disposed on a sidewall of the first upper gate electrode;
a second spacer disposed on a sidewall of the second upper gate electrode;
a third spacer covering the first spacer on the sidewall of the first upper gate electrode; and
a fourth spacer covering the second spacer on the sidewall of the second upper gate electrode,
wherein at least one of a first sidewall of the first lower gate electrode and a second sidewall of the first lower gate electrode is in contact with the third spacer, and
wherein the third spacer is in contact with a portion of the device isolation layer,
wherein an undercut region is defined by a bottom surface of the first upper gate electrode and at least one of the first sidewall and the second sidewall of the first lower gate electrode,
wherein the third spacer extends into the undercut region,
wherein the undercut region is further defined by a sidewall of the first gate dielectric layer and a top surface of the device isolation layer, and
wherein both of the first and second sidewalls of the first lower gate electrode are overlapped with the device isolation layer, and wherein the undercut region is confined by at least one of the first and second sidewalls of the first lower gate electrode.

10. The semiconductor device of claim 9, wherein the third spacer is in contact with a bottom surface of the first upper gate electrode.

11. The semiconductor device of claim 9, wherein the first upper gate electrode has a bottom width greater than the width of the first lower gate electrode, and a sidewall of the second lower gate electrode is aligned with a sidewall of the second upper gate electrode.

12. The semiconductor device of claim 9, wherein a portion of the device isolation layer, which is in contact with the third spacer, has a top surface lower than a top surface of the first active region.

13. The semiconductor device of claim 9, wherein a sidewall of the second lower gate electrode is in contact with the second spacer.

14. A semiconductor device comprising:
a device isolation layer defining an active region in a substrate;
a gate dielectric layer, a lower gate electrode, and an upper gate electrode sequentially stacked on the active region, the active region having a width less than a width of the lower gate electrode, and the upper gate electrode having a bottom width greater than the width of the lower gate electrode;
a first spacer on a sidewall of the upper gate electrode; and
a second spacer covering the first spacer to be in contact with a sidewall of the lower gate electrode,
wherein the second spacer is in contact with a portion of the device isolation layer,
wherein an undercut region is defined by a bottom surface of the first upper gate electrode and at least one of the first sidewall and the second sidewall of the first lower gate electrode,
wherein the third spacer extends into the undercut region,
wherein the undercut region is further defined by a sidewall of the first gate dielectric layer and a top surface of the device isolation layer, and
wherein a portion of a top surface of the device isolation layer overlapped with the first upper gate electrode includes a dent lower than another portion of the top surface of the device isolation layer not overlapped with the first upper gate electrode.

15. The semiconductor device of claim 14, wherein a portion of the device isolation layer, which is in contact with the second spacer, has a top surface lower than a top surface of the active region.

* * * * *